United States Patent [19]

Sato

[11] 4,419,628
[45] Dec. 6, 1983

[54] TRANSIENT-NOISE SIMULATORS

[75] Inventor: Yoshiro Sato, Tokyo, Japan

[73] Assignee: Tohoku Metal Industries, Ltd., Sendai, Japan

[21] Appl. No.: 243,643

[22] Filed: Mar. 13, 1981

[51] Int. Cl.³ .................. H03K 3/86; H03H 5/00; G01R 27/00

[52] U.S. Cl. .................................. 328/67; 333/32; 324/57 R

[58] Field of Search ............... 333/13, 22 R, 32, 81 R; 328/65, 67; 324/57 R

[56] References Cited

U.S. PATENT DOCUMENTS 1,601,023  9/1926  Hoyt ................................. 333/32 X

OTHER PUBLICATIONS

Terman: "Radio Engineers Handbook", McGraw Hill—1943—pp. 215-216.
Tandon: "Noise Simulators . . . "—Electronics—Mar. 7/1966, pp. 117-121.
Oliver and Cage: "Electronic Measurements & Inst", McGraw Hill—1971—pp. 61-64.

Primary Examiner—Michael J. Tokar
Assistant Examiner—Jose M. Solis
Attorney, Agent, or Firm—Posnack, Roberts, Cohen & Spiecens

[57] ABSTRACT

A noise simulator including a reflection absorbing circuit connected between a high-frequency noise pulse generator based on the principle of a charged delay line and a DC capacitor connected to the power line of the equipment under test. The reflection absorbing circuit is composed of a parallel resistor and a series resistor. The resistances of these resistors are determined so that the impedance at the input side of the reflection absorbing circuit in a condition that a predetermined standard impedance connected thereto is equal to the output impedance of the generator and that the impedance at the output side of the reflection absorbing circuit in the condition that the generator is connected thereto is equal to the predetermined standard impedance. A grounded electric conductor plate is movably disposed commonly adjacent to the series resistor and the DC-cut capacitor to adjust the stray capacitance prior to use for noise simulation.

3 Claims, 6 Drawing Figures

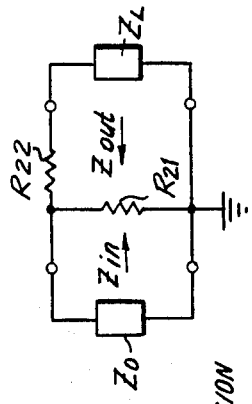
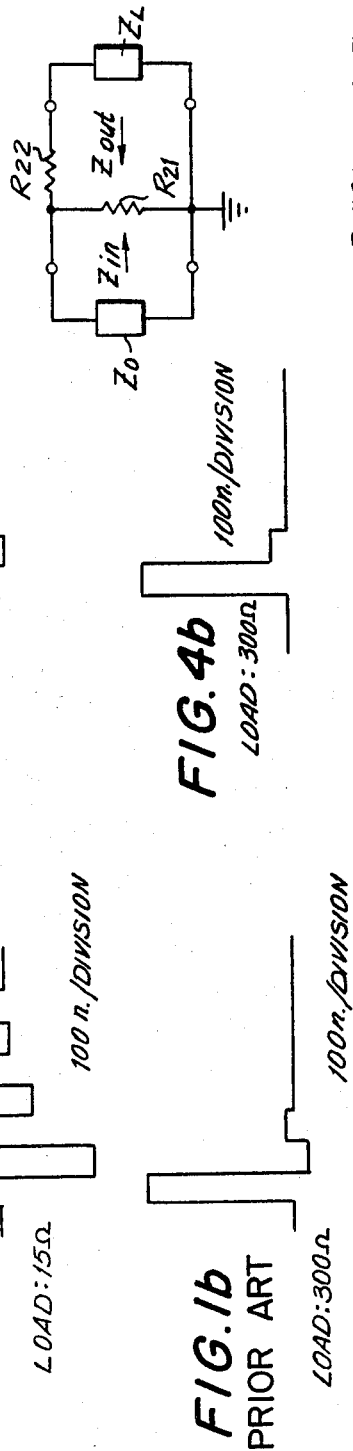
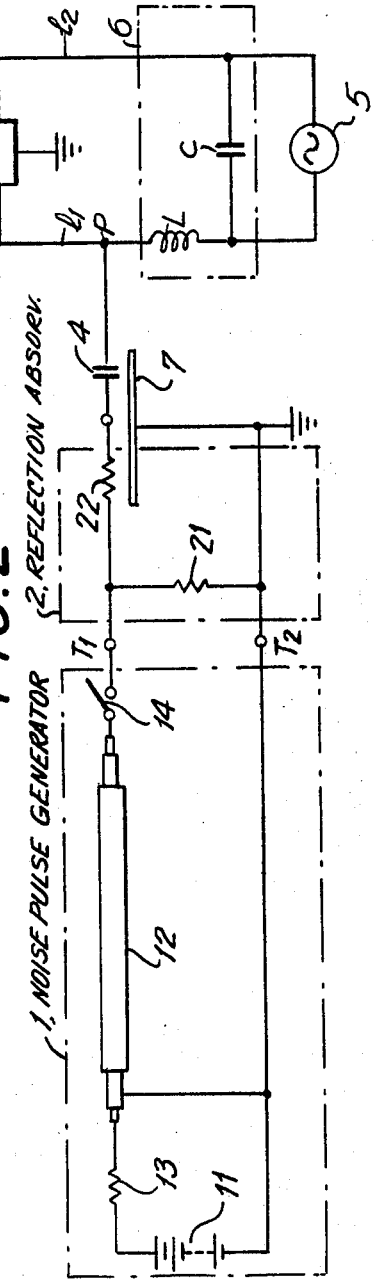

TRANSIENT-NOISE SIMULATORS

BACKGROUND OF THE INVENTION

(A) Field of the Invention

This invention relates to noise simulators, and, in particular, to improvements in such noise simulators wherein a simulated high-frequency pulse noise is reliably fed to electric equipment being tested without reflection.

(B) Prior Art

A noise simulator for feeding a high-frequency noise pulse to electrical equipment, such as data processors is disclosed in "Noise simulators help find peril in power-line defects" described by Mr. M. L. Tandon in Electronics, Mar. 7, 1966, pp. 117-121. Especially, in the drawing in page 120 in this article, a simulator for high-frequency transients simulation operates disclosed which is on the principle of a charged delay line. According to the description of the drawing, "a length of coaxial line (50Ω coaxial cable) is charged to a given voltage. The mercury-wetted relay $R_1$ is closed, initiating a pulse which travels in the direction of the one-megohm resistor. The resistor appears as an open circuit to the pulse, 100% reflection occurs, and the pulse travels back to the output of the coaxial line and is dissipated in the terminating 50-ohm resistor. A voltage appears across this impedance for the time it takes for the pulse to travel the length of the coaxial line and back. The amplitude of the pulse generated is one half that of the voltage to which the coaxial line has been charged. This pulse is coupled to the equipment by the three 0.1 microfarad capacitors C. A filter isolates the noise pulse to eliminate the possibility of interference with equipment not being tested."

Although a pulse can be generated in the simulator and injected onto the power line of the tested equipment, I found that the pulse waveform applied to the tested equipment changed in dependence on the input impedance of the equipment, as shown in FIGS. 1a and 1b. In certain input impedances of equipment, a vibratory wave is applied to the equipment as clearly shown in FIG. 1a. It is understood that this is caused by the existence of reflection due to the impedance mismatching. In this connection, the impedance matching is not established in the simulator of the above described literature.

On the other hand, since various types of equipment are tested by use of a noise simulator and since different equipment has different input impedance, it is difficult to establish impedance matching with various types of equipment.

SUMMARY OF THE INVENTION

Accordingly, it is an object of this invention to provide a noise simulator which can apply a noise pulse with less association of vibratory waves to equipment for noise simulation.

It is another object of this invention to provide a noise simulator having means for absorbing reflection from the equipment under test.

It is still another object of this invention to provide a noise simulator which is adjustable in impedance matching with a rated load.

It is yet another object of this invention to realize the above described objects with a simple circuit formation and low cost.

According to this invention, a noise simulator is provided which includes a high-frequency noise pulse generator means which is based on the principle of a charged delay line. A circuit composed of series resistor means and parallel resistor means is connected to the output of the generator means. The output of the circuit of resistor means is injected through capacitor means onto the power line of the equipment under test. The high-frequency noise pulse from the generator means is applied to the equipment through the circuit of resistor means, the capacitor means and the power line.

The resistances of the series resistor means and the parallel resistor means are determined so that the impedance at the input side of the resistor circuit in the condition that a predetermined impedance connected thereto is equal to the output impedance of the generator means, and that the impedance at the output side of the resistor circuit in the condition that the generator means is connected thereto equal to the predetermined impedance. The predetermined impedance is selected from a range within which the input impedances of various equipment to be tested by the simulator are included.

In the arrangement, even if the input impedance of the equipment to be tested is different from the predetermined impedance, the reflection of the signal from the equipment is absorbed an the circuit of the series and parallel resistor means. Accordingly, the noise pulse applied to the equipment is not substantially affected by the difference of the impedance of the tested equipment, and a reliable simulation can be performed.

In another aspect of this invention, grounded electric conductive plate means are movably disposed commonly adjacent to the series resistor means and the DC-cut capacitor means so that the distance from the series resistor means and the capacitor means to the plate means may be adjusted. The adjustment of the plate means can control the stray capacitance of the circuit for injecting a noise pulse onto the power line, whereby the effect of the stray capacitance to the test may be removed. The adjustment is performed at the calibration of the noise simulator by the use of a load of the predetermined impedance instead of equipment to be tested, prior to simulation.

Further objects, features and other aspects of this invention will be understood from the following description of preferred embodiments of this invention referring to the drawings annexed hereto.

BRIEF DESCRIPTION OF THE DRAWINGS

FIGS. 1a and 1b illustrate waveforms applied to different impedance loads by a known noise simulator;

FIG. 2 is a circuit diagram of an embodiment of this invention;

FIG. 3 is an equivalent circuit of the embodiment in FIG. 2 for explaining the determination of the resistances of series and parallel resistors; and FIGS. 4a and 4b illustrate waveforms applied to different impedance loads by the embodiment of this invention.

DETAILED DESCRIPTION OF PREFERRED EMBODIMENTS

Broadly speaking, this invention attempts to use a parallel resistor and a series resistor between a simulated-noise pulse generator on the principle of a charged delay line and a series capacitor connected to the power line, in order to absorb reflection of the noise pulse from the equipment under test, and in order to transform the input impedance of the equipment under test to decrease its variance as viewed from the output of the generator.

Referring to FIG. 2, the output of a known noise-pulse generator 1 on the principle of a charged delay line is connected to a reflection absorbing circuit 2.

Noise-pulse generator 1 includes a DC power supply 11. An inner conductor of a coaxial cable 12 is connected to a positive terminal of DC power supply 11 through a resistor 13, and an outer conductor of coaxial cable 12 connected to a negative electrode of DC power supply 11. The opposite end of the inner conductor of cable 12 is connected to an output terminal $T_1$ through a switching element 14, and the negative terminal of DC power supply 11 is connected to the other output terminal $T_2$. Coaxial cable 12 has a characteristic impedance $Z_0$ of, for example, $50\Omega(Z_0=50\Omega)$, resistor 13 has a resistance of, for example, 1 M$\Omega$. A mercury wetted high voltage switch is used as switching element 14, but other switching elements may be used as desired.

A reflection absorbing circuit 2 is connected to output terminals $T_1$ and $T_2$ of generator 1. Reflection absorbing circuit 2 is composed of a parallel resistor 21 and a series resistor 22. The resistances of these two resistors 21 and 22 are determined as will be described hereinafter.

The output terminal end of series resistor 22 is connected to a power line $l_1$ of equipment 3 to be tested, through a capacitor 4 for DC cut. The other output terminal is grounded.

AC power is fed to equipment 3 from an AC power supply 5 through power lines $l_1$ and $l_2$. An LC filter 6 is inserted in the power lines at one side of AC power supply 5 and at connection point P of capacitor 4 and power line $l_1$.

The chassis of equipment 3 is also grounded. Accordingly, the output signal of reflection absorbing circuit 2 is applied to equipment 3 through power line $l_1$.

In the arrangement, coaxial cable 12 is charged by DC power supply 11. When switching element 14 is closed or turned on, a discharge current flows through resistor 21 so that a transient pulse is applied to equipment 3 through resistor 22, capacitor 4 and power line $l_1$. However, it should be noted that the discharge current also flows through resistor 22, capacitor 4, and equipment 3. Accordingly, the impedance load on generator 1 changes in dependence on the input impedance of equipment 3. Therefore, the pulse wave applied to equipment 3 changes according to the input impedance of equipment 3 and, therefore, reflection of the applied pulse is produced at equipment 3 and various points of the circuit. This point is ignored in the circuit in the above described literature.

This invention considerably reduces the change of applied pulse waveform and reflections due to variation of the input impedance of equipment under test, by using series resistor 22 in addition to parallel resistor 21 and by determining the resistances of these two resistors 21 and 22 as follows:

Referring to FIG. 3, it is now assumed that the output impedance of the generator is $Z_0$, the resistances of resistors 21 and 22 being $R_{21}$ and $R_{22}$, the input impedance of equipment 3 being $Z_L$, and the impedances as viewed from the input side and the output side of reflection absorbing circuit 2 being $Z_{in}$ and $Z_{out}$, respectively. The capacitance of capacitor 4 is ignored in relation to high frequency signals.

In order to suppress reflection, $Z_O = Z_{in}$ and $Z_{out} = Z_L$. Where, $$Z_{in} = \frac{R_{21}(R_{22}+Z_L)}{R_{21}+R_{22}+Z_L} \text{ and } Z_{out} = R_{22} + \frac{Z_O R_{21}}{R_{21}+Z_O}$$

$$\therefore R_{21} = \frac{Z_O \cdot Z_L}{\sqrt{Z_L(Z_L-Z_O)}} \quad (1)$$

$$R_{22} = \sqrt{Z_L(Z_L-Z_O)} \quad (2)$$

If resistances $R_{21}$ and $R_{22}$ are determined to satisfy equations (1) and (2), no reflection of the transferred signal is present in the circuit.

The input impedance $Z_L$ of equipment 3 changes in dependence on change of the equipment to be tested, as described above. Therefore, it is difficult to change the resistances of resistors 21 and 22 in response to the equipment to be tested.

In this invention, resistances $R_{21}$ and $R_{22}$ are determined by selecting a predetermined value $Z_{LO}$ as the impedance $Z_L$. At that time, it should be noted that the variation of impedance $Z_{in}$ is less in comparison with the actual variation of impedance $Z_L$. Accordingly, even if different equipment is connected for simulation and even if the input impedance $Z_L$ is not equal to $Z_{LO}$, the signal reflected from the equipment is absorbed at resistors 21 and 22, because impedances $Z_{in}$ and $Z_{out}$ are comparatively near impedances $Z_O$ and $Z_L$. This is compared with the case of the known construction disclosed in the above described literature.

As will be understood from the above description, this invention does not attempt to merely establish an impedance matching. If impedance matching per se is attempted, it is necessary to use of a coaxial cable having a characteristic impedance corresponding to the input impedance of the equipment. However, it is not usable because the impedance load changes according to the equipment to be tested and the impedance variation is different from the characteristic impedance of the coaxial cable used.

The value $Z_{LO}$ should be selected from a range in which the input impedances of the equipment to be tested are generally included. In data processors, the range is 30–160$\Omega$.

When 95$\Omega$ is selected as a value of $Z_{LO}$ and when $Z_O=50\Omega$, $R_{21}=73\Omega$ and $R_{22}=65\Omega$. In the use of these resistances, the pulse waveforms applied to the load was observed for different loads of 15$\Omega$ and 300$\Omega$. The observed waveforms are illustrated in FIGS. 4a and 4b. In comparison with FIGS. 1a and 1b, it is understood that no vibratory wave present over the extent of the impedance load.

In the noise simulator, a high frequency noise pulse is applied to the power line. Accordingly, the stray capacitance in the line including resistor 22 and capacitor 4 is not ignored. However, if the stray capacitance is adjusted to be fixed prior the use for noise simulation, it does not effect to test. To this end, an electric conductor plate 7 is movably disposed commonly adjacent to resistor 22 and capacitor 4 and is grounded. The stray capacitance is adjusted by controlling the distance from resistor 22 and capacitor 4. The adjustment is made in calibration of the simulator by use of a standard load of an impedance $Z_{LO}$, prior to test.

According to this invention, since impedance transformation is made by the use of the parallel and series resistor, a coaxial cable of a comparatively low characteristic impedance such as 50Ω can be used, so that associated parts such as electrical connectors are comparatively small.

What is claimed is:

1. In a noise simulator for injecting simulated-noise pulse signals onto the AC power line of electrical equipment in a noise-simulating test, which includes pulse generator means operating as a charged delay line, and capacitor means for connecting the output of said pulse generator means to said AC power line, the improvement which comprises circuit means connected between the output of said pulse generator means and said capacitor means for absorbing any reflection wave reflected from said electrical equipment, said circuit means comprising first series resistor means connected between the output of said pulse generator means and said capacitor means and second parallel resistor means connected between the output of said pulse generator means and ground, the resistances of said first and second resistor means being determined so that the impedance at the input side of said reflection absorbing circuit means with a predetermined impedance load thereon is equal to the output impedance of said pulse generator means, while the impedance at the output side of said reflection absorbing circuit means with said generator means connected thereto is equal to said predetermined impedance, and grounded electrical conductor plate means movably disposed commonly adjacent said first resistor means and said capacitor means for controlling stray capacitance.

2. The improvement as claimed in claim 1, wherein the output impedance of said generator means is about 50Ω.

3. The improvement as claimed in claim 1, wherein the output impedance of said generator means is about 50Ω, said predetermined impedance being about 95Ω, the resistance of said first resistor means being about 65Ω, and the resistance of said second resistor means being about 73Ω.

* * * * *